United States Patent
Fu

(10) Patent No.: US 9,024,667 B1
(45) Date of Patent: May 5, 2015

(54) SELF-BIASED PHASE LOCK LOOP

(71) Applicant: Semiconductor Manufacturing International (Shanghai) Corporation, Shanghai (CN)

(72) Inventor: Zhigang Fu, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 14/267,763

(22) Filed: May 1, 2014

(30) Foreign Application Priority Data

Oct. 31, 2013 (CN) .......................... 2013 1 0530018

(51) Int. Cl.
  *H03L 7/06* (2006.01)
  *H03L 7/08* (2006.01)

(52) U.S. Cl.
  CPC ........................................ *H03L 7/08* (2013.01)

(58) Field of Classification Search
  USPC .................................................. 327/148, 157
  See application file for complete search history.

(56) References Cited

U.S. PATENT DOCUMENTS

| | | | |
|---|---|---|---|
| 6,434,206 B1 * | 8/2002 | Yu | 375/376 |
| 6,693,496 B1 * | 2/2004 | Lebouleux | 331/185 |
| 7,719,328 B2 | 5/2010 | Fu | |
| 7,986,191 B2 | 7/2011 | Peng et al. | |
| 8,487,677 B1 * | 7/2013 | Xue | 327/157 |
| 2007/0236297 A1 * | 10/2007 | Uozumi et al. | 331/16 |
| 2008/0186066 A1 * | 8/2008 | Jung et al. | 327/157 |
| 2009/0289725 A1 * | 11/2009 | Fu | 331/17 |
| 2010/0171535 A1 * | 7/2010 | Shanan | 327/157 |
| 2011/0273211 A1 * | 11/2011 | Chang et al. | 327/175 |
| 2012/0235718 A1 * | 9/2012 | Thakur et al. | 327/157 |
| 2012/0268178 A1 * | 10/2012 | Reddy | 327/157 |
| 2013/0257546 A1 * | 10/2013 | Xue, Dashun | 331/17 |
| 2014/0091954 A1 * | 4/2014 | Zhu et al. | 341/110 |
| 2014/0292387 A1 * | 10/2014 | Dasgupta et al. | 327/157 |

OTHER PUBLICATIONS

B. Robert Gregoire; Un-Ku Moon "A Sub 1-V Constant Gm—C Switched-Capacitor Current Source", IEEE Transactions on Circuits and Systems-II: Express Briefs, vol. 54, No. 3, Mar. 2007.

Low-Jitter Process-Independent DLL and PLL Based on Self-Biased Techniques (IEEE Journal of Solid-Statecircuits, vol. 31, No. 11, Nov. 1996, pp. 1723-1732).

Maneatis et al, "Self-biased high-bandwidth low-jitter 1-to-14096 multiplier clock generator PLL", (IEEE Journal of Solid-State Circuits, vol. 38, No. 11, Nov. 2003), pp. 1795-1803.

* cited by examiner

*Primary Examiner* — Adam Houston
(74) *Attorney, Agent, or Firm* — Innovation Counsel LLP

(57) ABSTRACT

A self-biased Phase Locked Loop (PLL) is provided. The self-biased PLL includes a bias current generator configured to generate a bias current Ib, wherein the bias current Ib includes one or more adjustable parameters for adjusting a loop bandwidth wn of the self-biased PLL. The one or more adjustable parameters in the bias current Ib includes at least one of a reference voltage Vref and a reference frequency Fref.

19 Claims, 2 Drawing Sheets

SELF-BIASED PHASE LOCK LOOP

CROSS-REFERENCE TO RELATED APPLICATIONS

This application claims priority to Chinese Patent Application No. 201310530018.8 filed on Oct. 31, 2013, the disclosure of which is incorporated herein by reference in its entirety.

BACKGROUND

1. Technical Field

The present disclosure relates to the field of phase locked loop, and in particular to a self-biased phase locked loop.

2. Description of the Related Art

A Phase Locked loop (PLL) is widely used in a System on Chip (SOC) to construct a frequency synthesizer, a clock generator, and the like.

A high performance PLL should ideally possess the following characteristics: low susceptibility to process, voltage, and temperature (PVT) variations; a wide frequency bandwidth; a low phase jitter and a small frequency change after being locked; a monolithic integrated filter; lower power consumption circuits, and the like.

However, it may be difficult to design a PLL having all of the above characteristics. The scaling and continuous reduction in device size introduces new challenges in designing high-speed, wide frequency bandwidth PLL chips. For example, the impact of PVT variations on PLL design typically increases with the scaling in device size.

Thus, when designing a conventional PLL, the impact of PVT variations has to be taken into consideration. Specifically, designing circuits in the conventional PLL requires an analysis of the impact of PVT variations on the stability of the PLL, and mitigating the impact of PVT variations so that the PLL is stable and meets performance requirements.

Different self-biased PLL designs have been proposed to address the problem of PVT variations. For example, the technical document titled "Self-Biased High-Bandwidth Low-Jitter 1-to-4096 Multiplier Clock Generator PLL," IEEE JOURNAL OF SOLID-STATE CIRCUITS, VoL. 38, No. 11, November 2003 discloses a self-biased PLL circuit comprising a low-pass filter having an active resistor. U.S. Pat. Nos. 7,719,328 and 7,986,191 disclose self-biased PLLs having simplified circuit structures that can be easily implemented.

However, the PLL configurations in the prior art have some disadvantages. A PLL typically has a fixed loop bandwidth once the PLL design has been locked in. As a result, the PLL circuit may not be capable of adjusting the loop bandwidth. For example, the PLL may have a fixed loop bandwidth after the parameters (e.g. resistance and capacitance values) in the PLL circuit have been selected.

In some cases, one way to adjust the loop bandwidth in the PLL is to adjust the charge pump current. Adjusting the charge pump current may provide a wider loop bandwidth in the PLL. However, it may be difficult to achieve a programmable charge pump current (in fractions of the current, such as ½ or ¼ of the charge pump current). As a result, the programmable charge pump current has limited flexibility for adjusting the loop bandwidth. Furthermore, the programmable charge pump current may become unstable when used to adjust the loop bandwidth in a PLL (in which the circuit parameters have already been selected).

SUMMARY

The present disclosure is directed to address at least the above issues in existing PLL designs relating to loop bandwidth adjustments and PVT variations.

According to some embodiments of the inventive concept, a self-biased Phase Locked Loop (PLL) is provided. The self-biased PLL includes a bias current generator configured to generate a bias current Ib, wherein the bias current Ib includes one or more adjustable parameters for adjusting a loop bandwidth wn of the self-biased PLL.

In some embodiments, the one or more adjustable parameters in the bias current Ib may include at least one of a reference voltage Vref and a reference frequency Fref.

In some embodiments, a relationship between the bias current Ib, the reference frequency Fref, and the reference voltage Vref may be given by: Ib=Fref*Vref*C, where C denotes a first constant.

In some embodiments, the loop bandwidth wn may be adjusted by adjusting the reference voltage Vref.

In some embodiments, the self-biased PLL may further include a loop filter coupled to the bias current generator, wherein the loop filter may be configured to generate a control voltage Vbn based on the bias current Ib.

In some embodiments, the self-biased PLL may further include a phase frequency detector, a charge pump, a voltage-controlled oscillator, and a frequency divider. The phase frequency detector may be configured to detect a reference signal having a reference frequency Fref and a feedback signal having a feedback frequency Ffb, to detect a phase difference and a frequency difference between the reference frequency Fref and the feedback frequency Ffb, and to generate a control pulse signal based the phase difference and the frequency difference. The charge pump may be configured to generate an output current Icp based on the control pulse signal from the phase frequency detector and the bias current Ib from the bias current generator, wherein the output current Icp may be proportional to the bias current Ib and is supplied to the loop filter. The voltage-controlled oscillator may be configured to generate, based on the control voltage Vbn from the loop filter, an output signal having an oscillation voltage. The frequency divider may be configured to divide the output signal so as to generate the feedback signal.

In some embodiments, the bias current generator may include a plurality of transistors comprising a first transistor, a second transistor, and a third transistor of a first conductivity type, and a fourth transistor and a fifth transistor of a second conductivity type; a plurality of switches comprising a first switch, a second switch, a third switch, a fourth switch, and a fifth switch; a plurality of capacitors comprising a first capacitor, a second capacitor, and a third capacitor; a first operational amplifier; and an adjustable voltage source.

In some embodiments, a first electrode of the first transistor and a second electrode of each of the second and third transistors may be connected in common to a first voltage potential; a gate and a first electrode of the second transistor may be connected together and further connected to a gate of each of the first and third transistors; a second terminal of each of the third switch, fourth switch, first capacitor, and second capacitor may be connected in common to a second voltage potential; a first terminal of each of the first capacitor, second switch, and fourth switch, and a second terminal of the first switch, may be connected in common to a first node; and a first terminal of each of the second capacitor and the fifth switch, and a second terminal of the second switch, may be connected in common to a second node.

In some embodiments, a second electrode of the first transistor may be connected to the second voltage potential via the third switch and may be connected to the first node via the first switch.

In some embodiments, a second terminal of the fifth switch may be connected to an inverting input terminal of the first operational amplifier; the adjustable voltage source may be connected between a non-inverting input terminal of the second operational amplifier and the second voltage potential, wherein the adjustable voltage source may be configured to provide a reference voltage Vref; the third capacitor may be connected between an output terminal and the inverting input terminal of the first operational amplifier; the output terminal of the first operational amplifier may be connected to a gate of the fourth transistor; a first electrode of the fourth transistor may be connected to the second voltage potential, and a second electrode of the fourth transistor may be connected to the gate and the first electrode of the second transistor; a gate and a first electrode of the fifth transistor may be connected together and further connected to a first electrode of the third transistor, a second electrode of the fifth transistor may be connected to the second voltage potential, and the gate of the fifth transistor may be further connected to the loop filter, and wherein the first and second switches may operate in accordance with a first clock signal; the third, fourth, and fifth switches may operate in accordance with a second clock signal; and the first and second clock signals may be generated based on the reference frequency Fref of non-overlapping clock signals.

In some embodiments, the loop filter may include a plurality of transistors comprising a sixth transistor and a seventh transistor of the first conductivity type, and an eighth transistor of the second conductivity type; a plurality of capacitors comprising a fourth capacitor and a fifth capacitor; and a second operational amplifier.

In some embodiments, the seventh transistor may be connected in series with the fifth capacitor and in parallel with the fourth capacitor; a non-inverting input terminal of the second operational amplifier may be configured to receive the output current Icp generated by the charge pump, and may be connected to a second electrode of the seventh transistor; an output terminal and an inverting input terminal of the second operational amplifier may be connected together and further connected to a second electrode of the sixth transistor; a first electrode of the seventh transistor may be connected to the second voltage potential via the fifth capacitor connected in series thereto; the fourth capacitor may be connected between the non-inverting input terminal of the second operational amplifier and the second voltage potential; a gate and a first electrode of the sixth transistor may be connected together and further connected to a gate of the seventh transistor and a second electrode of the eighth transistor; a gate of the eighth transistor of the loop filter may be connected to the gate of the fifth transistor of the bias current generator; a first electrode of the eighth transistor may be connected to the second voltage potential, and wherein the seventh transistor may be configured to operate in a linear region.

In some embodiments, the charge pump may include a ninth transistor of the first conductivity type, and a tenth transistor of the second conductivity type; and an up switch and a down switch.

In some embodiments, a first electrode of the seventh transistor may be connected to a second electrode of the tenth transistor, and when the down switch is closed, a first electrode of the tenth transistor may be connected to the non-inverting input terminal of the second operational amplifier.

In some embodiments, the output current Icp may be given by:

$Icp = x*Ib$ where $x$ denotes a second constant.

In some embodiments, the loop bandwidth wn may be given by:

$$wn = \sqrt{\frac{Kv*Icp}{M*Cp}} = \sqrt{\frac{k*x*Ib}{M*Cp*Cb}} = \sqrt{\frac{k*x*C*Fref*Vref}{M*Cp*Cb}} = \sqrt{\frac{k*x*C}{M*Cp*Cb}} * \sqrt{Vref*Fref}$$

where Kv denotes a gain of the voltage-controlled oscillator, Cp denotes a capacitance value of the fifth capacitor, M denotes a frequency division factor of the frequency divider, k denotes a process factor of equivalent transistors in the voltage-controlled oscillator, and Cb denotes an equivalent capacitance of the voltage-controlled oscillator.

In some embodiments, a resistor of the loop filter including the seventh transistor may have a resistance R, and a transconductance gm of the resistor may be given by:

$gm = \sqrt{2*k2*Ib}$ where k2 denotes a process factor of the seventh transistor.

In some embodiments, a loop damping factor Dp of the self-biased PLL may be given by:

$$Dp = \frac{R}{2}\sqrt{\frac{Kv*Icp*Cp}{M}} = \frac{1}{2*gm}\sqrt{\frac{k/Cb*Ib*Cp}{M}} = \frac{1}{2}\sqrt{\frac{k/Cb*Ib*Cp}{2*k2*Ib*M}} = \frac{1}{2}\sqrt{\frac{k*Cp}{2*k2*Cb*M}}$$

According to some other embodiments of the inventive concept, a method of adjusting a loop bandwidth wn of a self-biased PLL is provided. The method includes generating a bias current Ib comprising one or more adjustable parameters for adjusting the loop bandwidth wn of the self-biased PLL, wherein the one or more adjustable parameters in the bias current Ib includes at least one of a reference voltage Vref and a reference frequency Fref.

In some embodiments, the method may further include adjusting the loop bandwidth wn by adjusting the reference voltage Vref, wherein a relationship between the bias current Ib, the reference frequency Fref, and the reference voltage Vref may be given by:

$Ib = Fref*Vref*C$, where $C$ denotes a first constant.

BRIEF DESCRIPTION OF THE DRAWINGS

The accompanying drawings, which are incorporated herein and constitute a part of the specification, illustrate different embodiments of the inventive concept and, together with the description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Various embodiments of the inventive concept are next described with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments, do not limit the scope of the inventive concept unless otherwise specifically stated. In addition, techniques, methods, and devices as known by those skilled in the art, although omitted in some instances, are intended to be part of the specification where appropriate.

Figure 1:
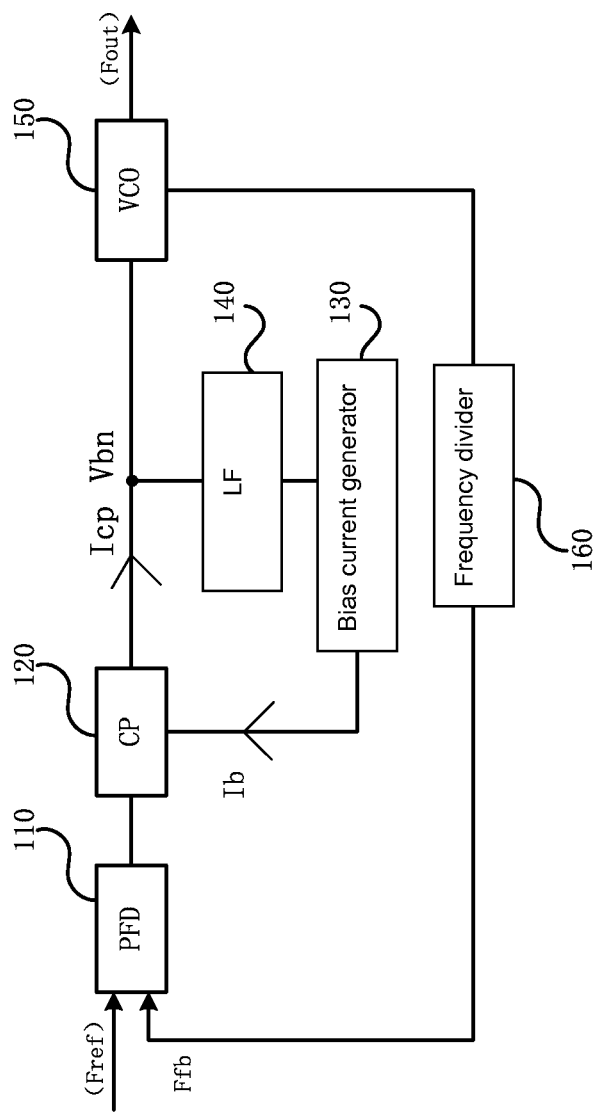
FIG. 1 is a schematic diagram of a basic structure of a self-biased PLL according to an embodiment of the inventive concept.

FIG. 1 is a schematic diagram of a self-biased PLL according to an embodiment of the inventive concept. As shown in FIG. 1, the self-biased PLL includes a phase frequency detector (PFD) 110, a charge pump (CP) 120, a bias current generator 130, a loop filter (LF) 140, a voltage-controlled oscillator (VCO) 150, and a frequency divider 160.

The phase frequency detector 110 is coupled to the charge pump 120 and the frequency divider 160. The phase frequency detector 110 is configured to receive an input signal having a reference frequency Fref and a feedback signal having a feedback frequency Ffb. The phase frequency detector 110 is further configured to detect a frequency difference and a phase difference between the reference frequency Fref and the feedback frequency Ffb, and to generate a pulse control signal based on the frequency difference and the phase difference.

The charge pump 120 is coupled to the phase frequency detector 110, the bias current generator 130, the loop filter 140, and the voltage-controlled oscillator 150. The charge pump 120 is configured to receive the pulse control signal from the phase frequency detector 110 and a bias current Ib from the bias current generator 130. The pulse control signal is used to control an output current Icp generated by the charge pump 120. The output current Icp may vary depending on an input current (e.g. the bias current Ib) supplied to the charge pump 120. For example, the output current Icp may be proportional to the bias current Ib, based on the pulse control signal received by the charge pump 120. The charge pump 120 is further configured to provide the output current Icp to the loop filter 140.

The bias current generator 130 is coupled to the charge pump 120 and the loop filter 140. The bias current generator 130 is configured to generate the bias current Ib. As previously described, the bias current Ib is supplied to the charge pump 120 and the loop filter 140.

The loop filter 140 is coupled to the bias current generator 130, the charge pump 120, and the voltage-controlled oscillator 150. The loop filter 140 is configured to generate a control voltage Vbn in response to the output current Icp generated by the charge pump 120. The control voltage Vbn is provided to the voltage-controlled oscillator 150, and is used to control a voltage of an output signal generated by the voltage-controlled oscillator 150. As previously described, the output current Icp may be proportional to the bias current Ib. Accordingly, the control voltage Vbn depends on the bias current Ib.

An example of a loop filter is described in more detail in U.S. Pat. No. 7,719,328 authored by the same inventor. FIG. 1 of U.S. Pat. No. 7,719,328 illustrates a loop filter 30 formed by connecting a resistor Rp and capacitor Cp in series, with the loop filter 30 coupled to a voltage-controlled oscillator 40. The disclosure of U.S. Pat. No. 7,719,328 is herein incorporated by reference.

Referring back to FIG. 1 of the present disclosure, the voltage-controlled oscillator 150 is coupled to the loop filter 140, the charge pump 120, and the frequency divider 160. The voltage-controlled oscillator 150 is configured to generate the output signal having an output frequency Fout, based on the control voltage Vbn from the loop filter 140. As shown in FIG. 1, the voltage-controlled oscillator 150 is further configured to send the output signal (as a feedback signal) back to the phase frequency detector 110 through the frequency divider 160.

The frequency divider 160 is connected to an output terminal of the voltage-controlled oscillator 150 and an input terminal of the phase frequency detector 110. Specifically, the frequency divider 160 is configured to generate the feedback signal having the feedback frequency Ffb, where Ffb=Fout/M, and M denotes a frequency division factor of the frequency divider 160.

The other functions of the phase frequency detector 110, the charge pump 120, the loop filter 140, and the VCO 150 are known to those skilled in the art and will not be further described here.

Generally, a loop bandwidth wn of a self-biased PLL is given by:

$$wn = \sqrt{\frac{Kv * Icp}{M * Cp}} \quad (1)$$

where Kv denotes a gain of the VCO; Cp denotes a capacitance of the loop filter; M denotes the frequency division factor of the frequency divider; and Icp denotes the output current generated by the charge pump.

The gain of the VCO may be given by:

$$Kv = k/Cb \quad (2)$$

where k denotes a process factor of the equivalent transistors in the VCO, and Cb denotes the equivalent (or parasitic) capacitance of the VCO.

As previously described, the output current Icp is generated by the charge pump 120 based on the bias current Ib from the bias current generator 130 and the pulse control signal from the phase frequency detector 110. The output current Icp may be given by:

$$Icp = x * Ib \quad (3)$$

where x is a constant.

Substituting Equations (2) and (3) into Equation (1) yields the following equation for the loop bandwidth wn:

$$wn = \sqrt{\frac{Kv * Icp}{M * Cp}} = \sqrt{\frac{k * x * Ib}{M * Cp * Cb}} \quad (4)$$

where x and M are constants, and Cp and Cb are the parameter values (capacitances) of the circuit elements. k denotes the process factor of the equivalent transistors in the VCO and may be treated as a constant. It is noted that the Cp and Cb values do not change substantially after they have been selected, and therefore the Cp and Cb values may also be treated as constants.

Accordingly, the remaining variable in Equation (4) is the bias current Ib generated by the bias current generator 130. If the bias current Ib can be adjusted according to an offset in the phase-locked loop, the loop bandwidth wn may then be correspondingly adjusted. In other words, the loop bandwidth wn of the PLL may be adjusted using the bias current Ib generated by the bias current generator 130. In particular, the loop bandwidth wn of the PLL may be adjusted by adjusting the bias current Ib, even when the parameters of the circuit elements (e.g. the capacitance values Cp and Cb, and the constants k, x, and M) are fixed.

In some embodiments, the loop bandwidth wn of the PLL may be adjusted based on the reference frequency Fref and the reference voltage Vref. The relationship between the bias current Ib, reference frequency Fref, and reference voltage Vref may be given as follows:

$$Ib = Fref * Vref * C \quad (5)$$

where C is a constant.

By substituting Equation (5) into Equation (4), the following equation for the loop bandwidth wn may be derived:

$$wn = \sqrt{\frac{Kv * Icp}{M * Cp}} = \sqrt{\frac{k * x * Ib}{M * Cp * Cb}} = \sqrt{\frac{k * x * C * Fref * Vref}{M * Cp * Cb}} = \sqrt{\frac{k * x * C}{M * Cp * Cb}} * \sqrt{Vref * Fref} \quad (6)$$

where x, M, C, and k are constants. As noted previously, the Cp and Cb are parameter values of the circuit elements, and do not change substantially after they have been selected (i.e. Cp and Cb may be treated as constants).

Accordingly, the remaining variables in Equation (4) are the reference frequency Fref and the reference voltage Vref. In other words, the loop bandwidth wn of the PLL may be adjusted based on the reference voltage Vref and the reference frequency Fref. In particular, the loop bandwidth wn of the PLL may be adjusted by adjusting the reference voltage Vref and the reference frequency Fref, even when the parameters of the circuit elements (e.g. the capacitance values Cp and Cb, and the constants x, M, k, and and C) are fixed.

In some embodiments (and in practice), the reference frequency Fref may be fixed. Accordingly, in those embodiments, the loop bandwidth wn of the PLL may be adjusted by changing only the reference voltage Vref.

It is noted that Equation (6) may be expressed in different forms and may include variations of the above-described embodiment. For example, the loop bandwidth wn of the PLL can be adjusted by adjusting reference voltages or bias currents from different sources.

As previously mentioned in the BACKGROUND section, the stability of the feedback loop needs to be considered when adjusting the loop bandwidth of the PLL. For example, the feedback loop may become unstable when the loop bandwidth of the PLL is adjusted beyond a certain range. The following embodiments of the inventive concept are directed to improve the stability of the feedback loop in the PLL during loop bandwidth adjustments.

The loop filter 140 may include an active resistor comprising transistors for providing an active resistance in a linear region. The active resistor is connected in series with capacitors in the loop filter 140, and the capacitance of the loop filter 140 is given by Cp. An example of a loop filter structure may be found in FIG. 6 of U.S. Pat. No. 7,719,328 (herein incorporated by reference), which illustrates a circuit structure for providing an active loop filter resistance. The loop filter disclosed in U.S. Pat. No. 7,719,328 includes a voltage follower and a filter structure, in which a transistor is used in the filter structure to provide the loop filter resistance Rp.

The loop damping factor Dp of the self-biased PLL of FIG. 1 is given by:

$$Dp = \frac{R}{2}\sqrt{\frac{Kv * Icp * Cp}{M}} \quad (7)$$

where Kv denotes the gain of the voltage controlled oscillator 150, Icp denotes the output current generated by the charge pump 120, Cp denotes the capacitance value of the loop filter 140, and M denotes the frequency division factor of the frequency divider 160.

Substituting Equations (2) and (3) into Equation (7) yields the following equation for the loop damping factor Dp:

$$Dp = \frac{R}{2}\sqrt{\frac{Kv * Icp * Cp}{M}} = \frac{R}{2}\sqrt{\frac{k * x * Ib * Cp}{M * Cb}} \quad (8)$$

The loop stability of the PLL is affected by damping. As seen in Equation (8), the loop damping factor Dp depends on the bias current Ib. In some instances, the adjustment to the loop bandwidth may involve changing the bias current Ib, which may cause the loop to be unstable. Accordingly, there is a need to reduce or eliminate the effects of the bias current Ib on the loop damping factor Dp, so as to improve the stability of the loop damping.

The active resistor in the loop filter 140 may be designed (via transistor implementation) to eliminate the effects of the bias current Ib on the loop damping factor Dp. In some embodiments, an active resistance R in the loop filter 140 may have a transconductance gm. If the active resistance R is provided by an active transistor in the linear region, the drain-source resistance Rds value of the transistor will be equal to the transconductance gm when the transistor operates in a saturation region. Accordingly, the transconductance gm of the active resistance R is given by:

$$gm = \sqrt{2 * k2 * Ib} \quad (9)$$

where k2 denotes a process factor of the transistor providing the active resistance R, and Ib denotes the bias current received by the loop filter 140 from the bias current generator 130.

Since R=1/gm, the following equation for the loop damping factor Dp is derived when Equations (3) and (9) are substituted into Equation (8):

$$Dp = \frac{R}{2}\sqrt{\frac{k * x * Ib * Cp}{M * Cb}} = \frac{1}{2gm}\sqrt{\frac{k * x * Ib * Cp}{M * Cb}} = \frac{1}{2}\sqrt{\frac{k * x * Ib * Cp}{2 * k2 * Ib * M * Cb}} = \frac{1}{2}\sqrt{\frac{k * x * Cp}{2 * k2 * Cb * M}} \quad (10)$$

As seen in Equation (10), the loop damping factor Dp depends on the ratios Cp/Cb and k/k2. As previously mentioned, Cp is the capacitance of the loop filter 140; Cb is the equivalent (or parasitic) capacitance of the voltage controlled oscillator 150; k denotes the process factor of the equivalent transistors in the VCO 150; and k2 denotes the process factor of the transistor providing the active resistance R in the loop filter 140. Accordingly, the loop damping factor Dp of the PLL (as given by Equation (10)) may be expressed independently of the bias current Ib. Instead, as shown in Equation (10), the loop damping factor Dp depends primarily on the process parameters and the values of the capacitances.

Accordingly, the loop bandwidth wn of the self-biased PLL may be adjusted by adjusting the bias current Ib without affecting the loop stability.

In addition, the effects on damping due to PVT variations can be substantially eliminated via the ratios Cp/Cb and k/k2 (the effects counteract within the ratios, thereby yielding a negligible net effect). In other words, the loop damping factor Dp may be substantially independent of changes in device processing, operating voltage or temperature. For example, the loop damping factor Dp is not affected by changes in the operating temperature of the PLL device. Accordingly, the stability of the self-biased PLL is not affected by PVT variations.

Figure 2:
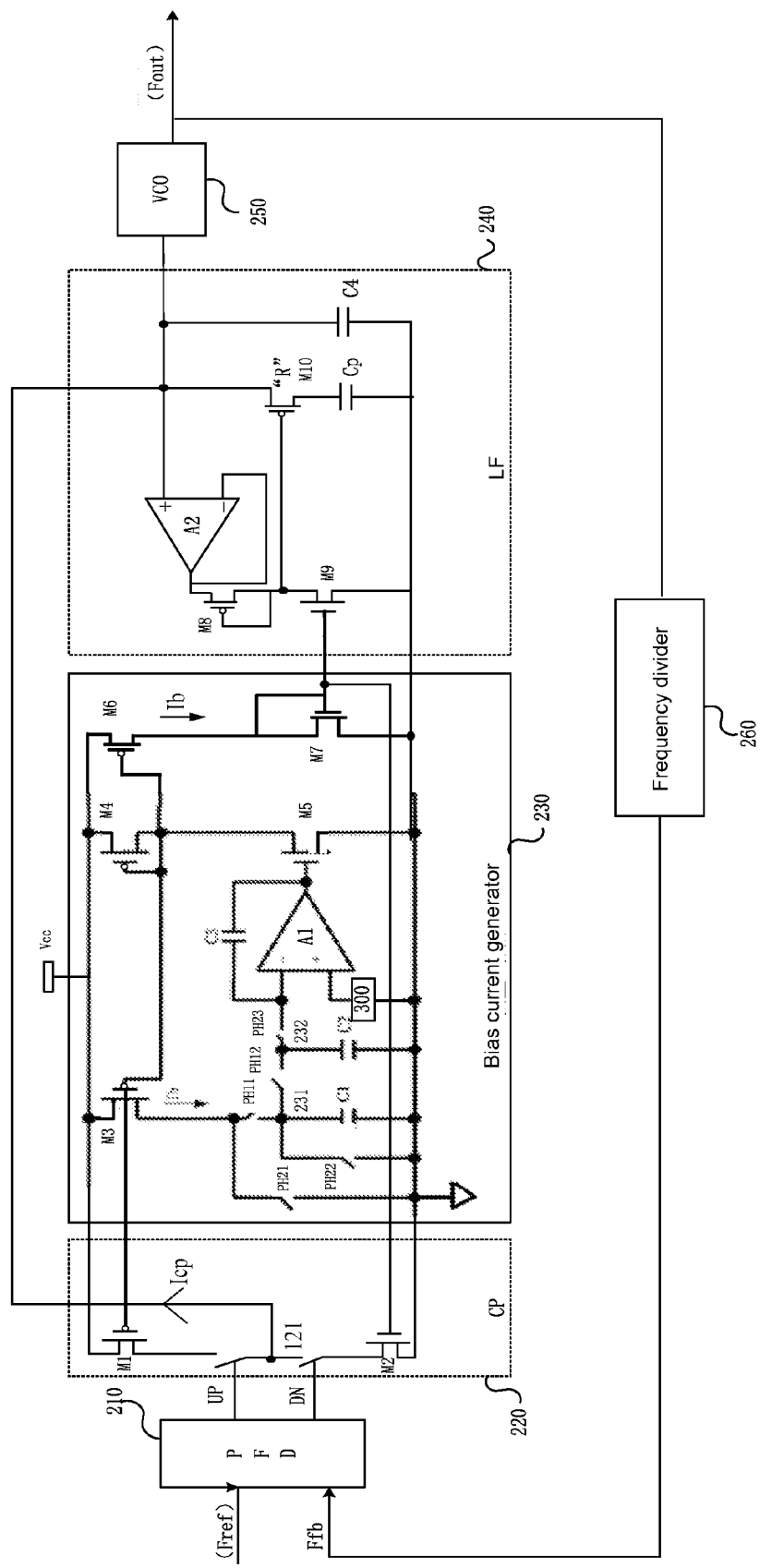
FIG. 2 is a circuit diagram of the self-biased PLL illustrated in FIG. 1 according to an embodiment of the inventive concept.

FIG. 2 is a circuit diagram of the self-biased PLL of FIG. 1 according to an embodiment of the inventive concept. As shown in FIG. 2, the self-biased PLL includes a phase frequency detector (PFD) 210, a charge pump (CP) 220, a bias current generator 230, a loop filter (LF) 240, a voltage-controlled oscillator (VCO) 250, and a frequency divider 260. The aforementioned elements in FIG. 2 are similar to the corresponding elements described previously with reference to FIG. 1, and therefore further description of those same elements shall be omitted.

As shown in FIG. 2, the bias current generator 230 is coupled to the charge pump 220 and the loop filter 240. The bias current generator 230 is configured to generate a bias current Ib, and supply the bias current Ib to the charge pump 220 and the loop filter 240.

As previously described, the bias current generator 230 is configured to generate a bias current Ib, wherein the bias current Ib includes one or more adjustable parameters for adjusting a loop bandwidth wn of the self-biased PLL. In some embodiments, the bias current Ib is generated based on a reference voltage Vref and a reference frequency Fref, for example, as shown in Equation (5).

With reference to FIG. 2, the bias current generator 230 includes a plurality of transistors M3, M4, and M6 of a first conductivity type (e.g. PMOS transistors); a plurality of transistors M5 and 7 of a second conductivity type (e.g. NMOS transistors); a plurality of capacitors C1, C2, and C3; a plurality of switches PH11, PH12, PH21, PH22, and PH23; an operational amplifier A1; and an adjustable voltage source 300.

A first electrode of the transistor M3 and a second electrode of each of the transistors M4 and M6 are connected to a first voltage potential (e.g. VCC power supply). The gate and a first electrode of the transistor M4 are connected together, and further connected to the gates of the transistors M3 and M6. A second electrode of the transistor M3 may be connected to a second voltage potential (e.g. ground) via the switch PH21. The second electrode of the transistor M3 may also be connected to a node 231 via the switch PH11.

A first terminal of each of the capacitor C1, switch PH22, and switch PH12, and a second terminal of the switch PH11, are connected to the node 231. A second terminal of the switch PH12, and a first terminal of each of the capacitor C2 and the switch PH23, are connected to a node 232. Also, a second terminal of each of the capacitors C1 and C2 and the switches PH21 and PH22 are connected to the second voltage potential.

A second terminal of the switch PH23 is connected to an inverting input terminal of the operational amplifier A1.

The adjustable voltage source 300 is connected between a non-inverting input terminal of the operational amplifier A1 and the second voltage potential. The adjustable voltage source 300 is configured to provide a reference voltage Vref.

The capacitor C3 is connected between an output terminal and the inverting input terminal of the operational amplifier A1. The output of the operational amplifier A1 is connected to the gate of the transistor M5.

A first electrode of the transistor M5 is connected to the second voltage potential, and a second electrode of the transistor M5 is connected to the gate and the first electrode of the transistor M4.

The gate and a first electrode of the transistor M7 are connected together, and further connected to the first electrode of the transistor M6. A second electrode of the transistor M7 is connected to the second voltage potential. The gate of the transistor M7 is connected to the loop filter 240.

The switches PH11 and PH12 operate in accordance with a clock signal PH1, and the switches PH21, PH22, and PH23 operate in accordance with a clock signal PH2. The clock signals PH1 and PH2 depend on the reference frequency Fref of non-overlapping clock signals (where Fref is associated with the input reference frequency). Accordingly, the output current Ib generated by the bias current generator 230 is related to the reference frequency Fref, and satisfies Equation (5):

$$Ib=Fref*Vref*C \qquad (5)$$

Referring to FIG. 2, the charge pump 220 includes a transistor M1 of a first conductivity type (e.g. PMOS transistor) and a transistor M2 of a second conductivity type (e.g. NMOS transistor).

The gate of the transistor M4 in the bias current generator 230 is connected to the gate of the transistor M1 in the charge pump 220. Also, the gate of the transistor M7 in the bias current generator 230 is connected to the gate of the transistor M2 in the charge pump 220.

The output current Icp is generated when the bias current Ib flows through the transistors M1 to M4.

A more detailed description of the bias current generator 230 in FIG. 2 may be found in a technical paper authored by B. Robert Gregoire and Un-Ku Moon titled "A Sub 1-V Constant Gm-C Switched-Capacitor Current Source", IEEE TRANSACTIONS ON CIRCUITS AND SYSTEMS-II: EXPRESS BRIEFS, VOL 54, NO 3, MARCH 2007.

As mentioned above, the circuit according to the embodiment of the inventive concept in FIG. 2 satisfies Equation (5):

$$Ib=Fref*Vref*C \qquad (5)$$

It should be understood that the above example merely illustrates an embodiment of the inventive concept. One of ordinary skill would readily appreciate that other circuit configurations may be designed satisfying the above equations.

Referring to FIG. 2, the loop filter 240 includes a plurality of transistors M8 and M10 of a first conductivity type (e.g. PMOS transistor); a transistor M9 of a second conductivity type (e.g. NMOS transistor); a plurality of capacitors Cp and C4; and an operational amplifier A2.

The operational amplifier A2 is used as a voltage follower, such that its output voltage is equal to its input voltage (the inverting input terminal and the output terminal of the operational amplifier A2 are connected together).

The non-inverting input terminal of the operational amplifier A2 is configured to receive the output current Icp generated by the charge pump 220. The non-inverting input terminal of the operational amplifier A2 is connected to a second electrode of the transistor M10, and the output terminal of the operational amplifier A2 is further connected to a second electrode of the transistor M8.

A first electrode of the transistor M10 in the loop filter 240 is connected to a second electrode of the transistor M2 in the charge pump 220. A first electrode of the transistor M2 may be connected to a node 121 via a DN switch. When the DN switch is closed, the first electrode of the transistor M2 is connected to the non-inverting input of the operational amplifier A2.

The first electrode of the transistor M10 is also connected to the second voltage potential via the capacitor Cp connected in series thereto.

The capacitor C4 is connected between the non-inverting input terminal of the operational amplifier A2 and the second voltage potential.

The second electrode of the transistor M8 is connected to the inverting input terminal and the output terminal of the operational amplifier A2. The gate and a first electrode of the transistor M8 are connected together, and further connected to the gate of the transistor M10 and a second electrode of the transistor M9.

The gate of the transistor M9 in the loop filter 240 is connected to the gate of the transistor M7 in the bias current generator 230. A first electrode of the transistor M9 is connected to the second voltage potential.

In the circuit structure of FIG. 2, the transistor M10 is configured to operate in the linear region, whereby the active resistance of the loop filter 240 is denoted as R, and the transconductance gm of the active resistance R is given by Equation (9):

$$gm = \sqrt{2 \ast k2 \ast Ib} \tag{9}$$

When the loop filter 240 includes the active resistance R provided by the transistor M10 operating in the linear region, the loop damping factor Dp of the PLL may be independent of PVT variations (e.g. operating temperature), as provided in Equation (6).

In addition, since the bias current Ib is dependent on the reference voltage Vref, the loop bandwidth wn of the PLL may be adjusted by adjusting the reference voltage Vref, even when the other circuit parameters have already been selected. As a result of the increased flexibility in adjusting the loop bandwidth wn, the scope of applications that may include the self-biased PLL is broadened.

As previously described, the transistors of the first conductivity type may correspond to PMOS transistors, and the transistors of the second conductivity type may correspond to NMOS transistors. Nevertheless, it should be noted that the inventive concept is not limited to the above configuration of transistors. For example, in some other embodiments, the transistors of the first conductivity type may correspond to NMOS transistors, and the transistors of the second conductivity type may correspond to PMOS transistors.

It is noted that the self-biased PLL according to the inventive concept may include any one of the preceding embodiments, or any combination of the preceding embodiments.

According to the inventive concept, the loop bandwidth wn of the self-biased PLL can be adjusted based on the reference frequency and the reference voltage of the input signal, while maintaining loop stability. In particular, the reference voltage can be adjusted to adjust the size of a bias from the PLL loop bandwidth. Thus, compared to the prior art, the inventive concept allows the loop bandwidth to be easily adjusted and is less affected by PVT variations.

It is noted that some details may have been omitted to avoid obscuring the inventive concept. Nonetheless, the inventive concept should be apparent to one of ordinary skill in the art based on the aforementioned description with reference to the drawings.

The elements in the different embodiments of the inventive concept may be applied interchangeably, and may be implemented using any combination of software, hardware, and/or firmware. In some embodiments, the inventive concept may be implemented as a program recorded in a recording medium, and the program may include readable instructions that are executable by a machine. For example, the steps for adjusting the loop bandwidth in the described embodiments may be stored as a program in a computer readable storage medium, and the storage media may include ROM, RAM, disk drives, or an optical disk medium capable of storing program codes.

It is further noted that the above sequence of steps in the exemplary method is merely illustrative in nature, and need not be performed in particular order unless otherwise specified.

While the inventive concept has been described with reference to different embodiments, it is noted that the present disclosure is not limited to the above embodiments, and the embodiments may be modified without departing from the scope and spirit of the present disclosure. The scope of the following claims is to be accorded the broadest interpretation, which encompasses all modifications and equivalent structures and functions.

What is claimed is:

1. A self-biased Phase Locked Loop (PLL), comprising:
a bias current generator configured to generate a bias current Ib, wherein the bias current Ib includes one or more adjustable parameters for adjusting a loop bandwidth wn of the self-biased PLL, and
wherein the one or more adjustable parameters in the bias current Ib includes at least one of a reference voltage Vref and a reference frequency Fref.

2. The self-biased PLL of claim 1, wherein a relationship between the bias current Ib, the reference frequency Fref, and the reference voltage Vref is given by:

$$Ib = Fref \ast Vref \ast C, \text{ where } C \text{ denotes a first constant.}$$

3. The self-biased PLL of claim 2, wherein the loop bandwidth wn is adjusted by adjusting the reference voltage Vref.

4. The self-biased PLL of claim 1, further comprising:
a loop filter coupled to the bias current generator, wherein the loop filter is configured to generate a control voltage Vbn based on the bias current Ib.

5. The self-biased PLL of claim 4, further comprising:
a phase frequency detector configured to detect a reference signal having a reference frequency Fref and a feedback signal having a feedback frequency Ffb, to detect a phase difference and a frequency difference between the reference frequency Fref and the feedback frequency Ffb, and to generate a control pulse signal based the phase difference and the frequency difference;
a charge pump configured to generate an output current Icp based on the control pulse signal from the phase frequency detector and the bias current Ib from the bias current generator, wherein the output current Icp is proportional to the bias current Ib and is supplied to the loop filter;
a voltage-controlled oscillator configured to generate, based on the control voltage Vbn from the loop filter, an output signal having an oscillation voltage; and
a frequency divider configured to divide the output signal so as to generate the feedback signal.

6. The self-biased PLL of claim 5, wherein the bias current generator comprises:
a plurality of transistors comprising a first transistor, a second transistor, and a third transistor of a first conductivity type, and a fourth transistor and a fifth transistor of a second conductivity type;

a plurality of switches comprising a first switch, a second switch, a third switch, a fourth switch, and a fifth switch;
a plurality of capacitors comprising a first capacitor, a second capacitor, and a third capacitor;
a first operational amplifier; and
an adjustable voltage source.

7. The self-biased PLL of claim 6, wherein:
a first electrode of the first transistor and a second electrode of each of the second and third transistors are connected in common to a first voltage potential,
a gate and a first electrode of the second transistor are connected together and further connected to a gate of each of the first and third transistors,
a second terminal of each of the third switch, fourth switch, first capacitor, and second capacitor are connected in common to a second voltage potential,
a first terminal of each of the first capacitor, second switch, and fourth switch, and a second terminal of the first switch, are connected in common to a first node, and
a first terminal of each of the second capacitor and the fifth switch, and a second terminal of the second switch, are connected in common to a second node.

8. The self-biased PLL of claim 7, wherein a second electrode of the first transistor is connected to the second voltage potential via the third switch and connected to the first node via the first switch.

9. The self-biased PLL of claim 7, wherein:
a second terminal of the fifth switch is connected to an inverting input terminal of the first operational amplifier,
the adjustable voltage source is connected between a non-inverting input terminal of the second operational amplifier and the second voltage potential, wherein the adjustable voltage source is configured to provide a reference voltage Vref;
the third capacitor is connected between an output terminal and the inverting input terminal of the first operational amplifier;
the output terminal of the first operational amplifier is connected to a gate of the fourth transistor;
a first electrode of the fourth transistor is connected to the second voltage potential, and a second electrode of the fourth transistor is connected to the gate and the first electrode of the second transistor,
a gate and a first electrode of the fifth transistor are connected together and further connected to a first electrode of the third transistor, a second electrode of the fifth transistor is connected to the second voltage potential, and the gate of the fifth transistor is further connected to the loop filter, and
wherein the first and second switches operate in accordance with a first clock signal; the third, fourth, and fifth switches operate in accordance with a second clock signal; and the first and second clock signals are generated based on the reference frequency Fref of non-overlapping clock signals.

10. The self-biased PLL of claim 9, wherein the loop filter comprises:
a plurality of transistors comprising a sixth transistor and a seventh transistor of the first conductivity type, and an eighth transistor of the second conductivity type;
a plurality of capacitors comprising a fourth capacitor and a fifth capacitor; and
a second operational amplifier.

11. The self-biased PLL of claim 10, wherein the seventh transistor is connected in series with the fifth capacitor and in parallel with the fourth capacitor, a non-inverting input terminal of the second operational amplifier is configured to receive the output current Icp generated by the charge pump, and is connected to a second electrode of the seventh transistor,
an output terminal and an inverting input terminal of the second operational amplifier are connected together and further connected to a second electrode of the sixth transistor,
a first electrode of the seventh transistor is connected to the second voltage potential via the fifth capacitor connected in series thereto,
the fourth capacitor is connected between the non-inverting input terminal of the second operational amplifier and the second voltage potential,
a gate and a first electrode of the sixth transistor are connected together and further connected to a gate of the seventh transistor and a second electrode of the eighth transistor,
a gate of the eighth transistor of the loop filter is connected to the gate of the fifth transistor of the bias current generator,
a first electrode of the eighth transistor is connected to the second voltage potential, and
wherein the seventh transistor is configured to operate in a linear region.

12. The self-biased PLL of claim 11, wherein the charge pump comprises:
a ninth transistor of the first conductivity type, and a tenth transistor of the second conductivity type; and
an up switch and a down switch.

13. The self-biased PLL of claim 12, wherein:
a first electrode of the seventh transistor is connected to a second electrode of the tenth transistor,
and when the down switch is closed, a first electrode of the tenth transistor is connected to the non-inverting input terminal of the second operational amplifier.

14. The self-biased PLL of claim 13, wherein the output current Icp is given by:

$$Icp = x*Ib$$

where x denotes a second constant.

15. The self-biased PLL of claim 14, wherein the loop bandwidth wn is given by:

$$wn = \sqrt{\frac{Kv*Icp}{M*Cp}} = \sqrt{\frac{k*x*Ib}{M*Cp*Cb}} = \sqrt{\frac{k*x*C*Fref*Vref}{M*Cp*Cb}} = \sqrt{\frac{k*x*C}{M*Cp*Cb}} * \sqrt{Vref*Fref}$$

where Kv denotes a gain of the voltage-controlled oscillator,
Cp denotes a capacitance value of the fifth capacitor, M denotes a frequency division factor of the frequency divider, k denotes a process factor of equivalent transistors in the voltage-controlled oscillator, and Cb denotes an equivalent capacitance of the voltage-controlled oscillator.

16. The self-biased PLL of claim 15, wherein a resistor of the loop filter including the seventh transistor has a resistance R, and a transconductance gm of the resistor is given by:

$$gm = \sqrt{2*k2*Ib}$$

where k2 denotes a process factor of the seventh transistor.

17. The self-biased PLL of claim 16, wherein a loop damping factor Dp of the self-biased PLL is given by:

$$Dp = \frac{R}{2}\sqrt{\frac{Kv*Icp*Cp}{M}} = \frac{1}{2*gm}\sqrt{\frac{k/Cb*Ib*Cp}{M}} = \frac{1}{2}\sqrt{\frac{k/Cb*Ib*Cp}{2*k2*Ib*M}} = \frac{1}{2}\sqrt{\frac{k*Cp}{2*k2*Cb*M}}.$$

18. A method of adjusting a loop bandwidth wn of a self-biased PLL, comprising:
generating a bias current Ib comprising one or more adjustable parameters for adjusting the loop bandwidth wn of the self-biased PLL,
wherein the one or more adjustable parameters in the bias current Ib includes at least one of a reference voltage Vref and a reference frequency Fref.

19. The method of claim 18, further comprising:
adjusting the loop bandwidth wn by adjusting the reference voltage Vref, wherein a relationship between the bias current Ib, the reference frequency Fref, and the reference voltage Vref is given by:

$Ib = Fref*Vref*C$, where $C$ denotes a first constant.

\* \* \* \* \*